United States Patent [19]
Johnson

[11] 3,961,877
[45] June 8, 1976

[54] REINFORCED WAFER BASKET

[75] Inventor: Douglas M. Johnson, Carver, Minn.

[73] Assignee: Fluoroware, Inc., Chaska, Minn.

[22] Filed: Sept. 11, 1974

[21] Appl. No.: 504,904

[52] U.S. Cl. ............................ 432/253; 214/26; 432/261
[51] Int. Cl.² ........................................ F27D 5/00
[58] Field of Search ............... 432/253, 258, 261; 214/23, 26

[56] References Cited
UNITED STATES PATENTS

| | | | |
|---|---|---|---|
| 1,885,691 | 11/1932 | Dressler | 432/253 |
| 3,467,242 | 9/1969 | DeRousse | 206/1 |
| 3,473,670 | 10/1969 | Elftmann | 211/41 |
| 3,486,631 | 12/1969 | Rodman | 211/41 |
| 3,487,948 | 1/1970 | Haidegger | 211/41 |
| 3,534,862 | 10/1970 | Shambelan | 211/41 |
| 3,701,558 | 10/1972 | Baker | 294/33 |
| 3,737,282 | 6/1973 | Hearn | 432/253 |
| 3,819,076 | 6/1974 | Hammond | 432/253 |
| 3,828,726 | 8/1974 | Dietze et al. | 118/500 |
| 3,850,296 | 11/1974 | Hirata et al. | 211/41 |

*Primary Examiner*—John J. Camby
*Attorney, Agent, or Firm*—H. Dale Palmatier; James R. Haller

[57] ABSTRACT

A distortion-resistant wafer basket with an open top for insertion and removal of wafers and opposed side and end walls with the side walls having lower portions offset inwardly. An end wall is provided with a transverse indexing bar across its width and gussets joining opposing side walls with the indexing bar and spaced axially inwardly of the outer surface of the end wall. The gussets strengthen the end wall against distortion, and co-act with the offset side walls to stiffen the basket and to restrain twisting or bowing of the side walls.

13 Claims, 5 Drawing Figures

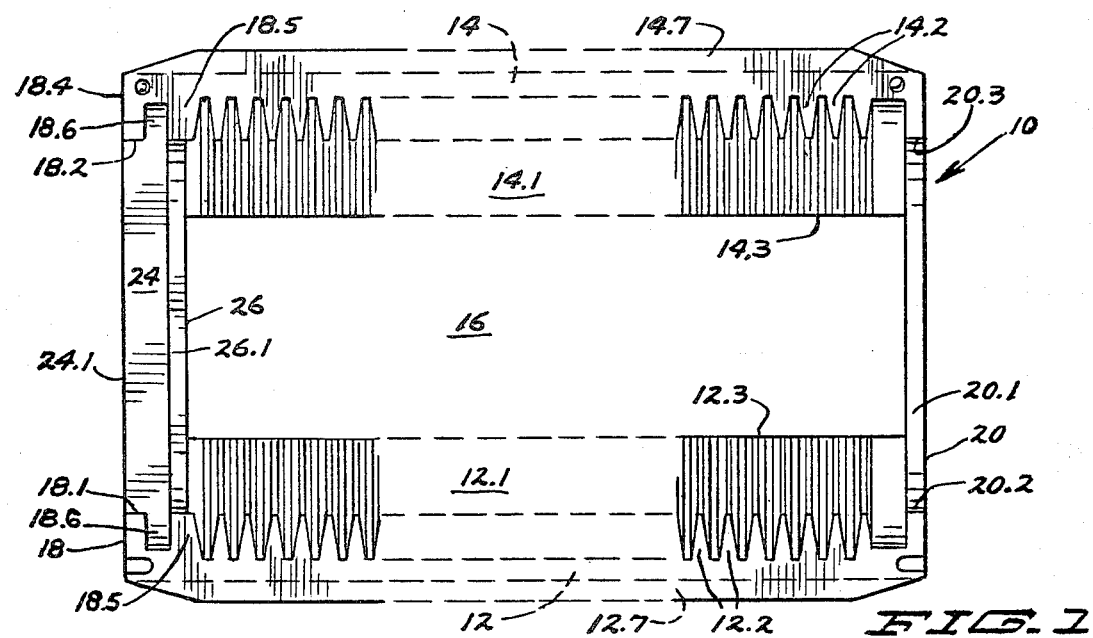
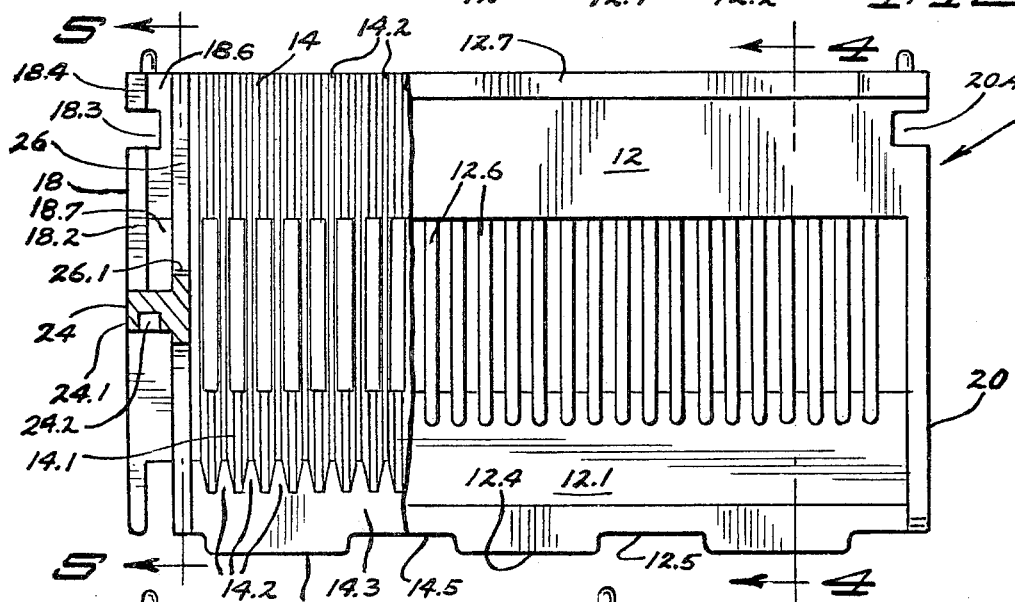
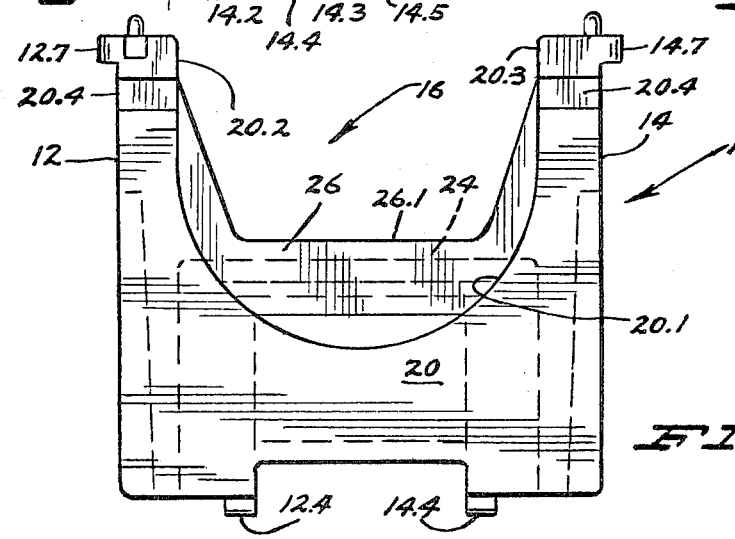

REINFORCED WAFER BASKET

BACKGROUND OF THE INVENTION

In the semi-conductor industry, the fragility of semi-conductor wafers such as those made of silicon presents unusual problems with respect to the handling and storage of such wafers. During processing, the wafers may be successively exposed to processing liquids which may be very hot and are often corrosive. Such processing also may require that the wafers be subjected to centrifugal forces during drying or the like. Wafers ordinarily may be processed in chemical baths and centrifuged while they are carried in "wafer baskets", which are small racks of a size suitable to accommodate particular wafer sizes and which have side walls with wafer-separating ribs so that the wafers may be stacked in a basket in spaced, axial alignment. Wafer baskets of the type described should be resistant to the temperature and corrosive nature of processing baths, and desirably are made of a temperature and chemical-resistant plastic which is sufficiently soft to avoid scratching or abrading of wafers. Since the basket carrying the wafers is imersed in and removed from baths of hot processing fluids, such baskets ordinarily are provided with open tops and bottoms, and slotted sides, all of which permit processing solutions to uniformly contact the wafers when the basket is inserted in a bath and to drain from the wafers when the basket is removed. Most plastic materials which can appropriately be employed for wafer baskets and particularly when in the form of thin sections necessitated by such baskets, weaken when exposed to high temperatures, and this fact, coupled with the necessarily open nature of such baskets as described above and the thin sections which are employed, may cause baskets to deform during processing, injuring the wafers.

BRIEF DESCRIPTION OF THE INVENTION

The invention provides a reinforced distortion resistant wafer basket having an open top for insertion and removal of wafers, opposed end walls, and side walls with inner, opposed ribs for spacing axially aligned wafers in the basket. The side walls have lower inwardly ribbed portions which are offset inwardly for stiffening these walls and for supporting the wafers from beneath. An end wall of the basket is centrally recessed and is provided with a transverse indexing bar across its width and intermediate its heighth for indexing the basket with respect to automatic wafer processing equipment. The end wall includes stiffening gussets joining opposing side walls and the indexing bar and spaced axially inwardly of the outer surface of the end wall. The gussets strengthen the end wall against distortion and co-act with the offset side walls of the basket to stiffen the basket and to restrain twisting or bowing of the side walls.

BRIEF DESCRIPTION OF THE DRAWING

FIG. 1 is a plan view of a wafer basket of the invention with some central, repeating details omitted;

FIG. 2 is a side view of the wafer basket of FIG. 1, shown in partial cross-section;

FIG. 3 is an end view of the wafer basket of FIG. 2;

BRIEF DESCRIPTION OF THE PREFERRED EMBODIMENT

Figure 4:
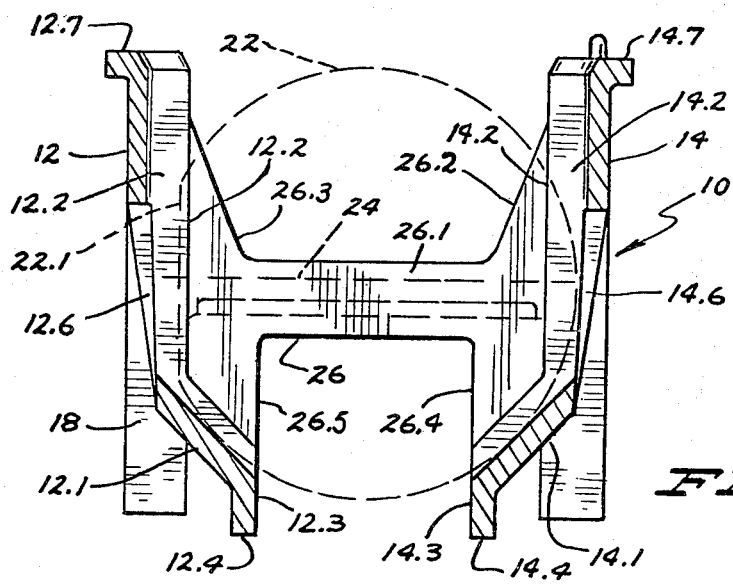
FIG. 4 is a cross-sectional view of a wafer basket of the invention taken along line 4—4 of FIG. 2 and showing, in phantom lines, a wafer contained in the basket.
Figure 5:
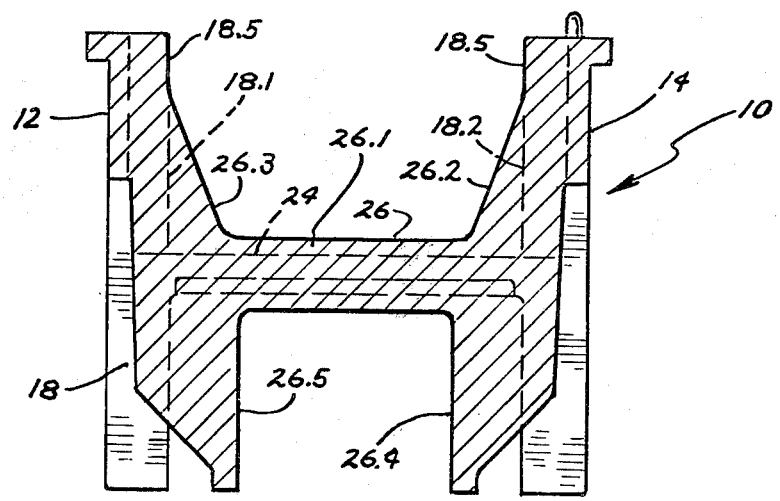
FIG. 5 is a cross-sectional view taken along line 5—5 of FIG. 2.

Referring first to FIGS. 1–3, a wafer basket designated generally as 10 is provided with generally upright side walls 12, 14, and open top 16 and end walls 18, 20. The side walls have lower portions 12.1, 14.1 which are offset inwardly, as shown best in FIG. 4, and the inner surfaces of which provide generally upward supporting surfaces for wafers within the basket. At its inner surface, the side wall 12 is provided with a series of spaced, inwardly projecting ribs 12.2 which are aligned with identical ribs 14.2 extending inwardly of the other side wall 14, the ribs being spaced from one another a sufficient distance to enable insertion of a series of wafers therebetween, the wafers being carried axially of the basket and being spaced from one another by the ribs. The ribs 14.2, 12.2 extend generally vertically downwardly and then inwardly on the offset side wall portions 12.1, 14.1, the lower ribs serving to also separate and support wafers within the basket. As shown in FIG. 4, the offset side wall portions 12.1, 14.1 may form a sharp, oblique angle with the adjacent upper side wall sections, but if desired, the offset portions may curve inwardly as depicted in commonly owned U.S. application Ser. No. 465,337, filed Apr. 29, 1974. The offsetting of the side walls tends to stiffen the side walls and restrain them from bowing inwardly or outwardly during wafer processing. The inner surface of the offset side walls may be substantially straight, as shown in FIG. 4, or may be curved as depicted in the above-identified patent application to provide wafer support surfaces which are curved to the generally circular, peripheral contour of the wafers and which support the wafers over a substantial portion of their peripheries.

The offset side wall portions 12.1, 14.1 extend downwardly and inwardly, and terminate in spaced, opposed walls 12.3, 14.3 providing the basket 10 with an open bottom. Along their bottom edges, the offset side walls are provided with spaced feet 12.4, 14.4 which enable the basket to rest on a horizontal planar surface with the lower edges 12.5, 14.5 of the walls spaced above the planar surface to permit processing fluid to flow into and out of the basket from beneath.

Intermediate their heighth, the side walls are cut away between ribs to permit processing solutions to flow into and out of the basket between the ribs. The ribs extend downwardly through the cut-out portion of the side walls, and are provided with small gussets 12.6, 14.6 (FIG. 4) at their outer edges, the gussets serving to strengthen and stiffen the rib sections of the side walls.

Referring to FIG. 4, the ribs 12.2, 14.2 which extend generally vertically along the upper, inner surface of the side walls are deeper than are the ribs extending upwardly and inwardly from the inner surfaces of the offset side wall portion; the deeper ribs are required to properly space wafers (one of which is shown in phantom lines as 22 in FIG. 4), since such wafers often have a portion of their peripheral surfaces flattened, for orientation purposes, as designated 22.1 in FIG. 4. The upper edges of the side walls may be provided with outwardly extending, longitudinal flanges 12.7, 14.7 to further stiffen the side walls against bowing inwardly at their upper edges.

The end wall 18 of the wafer basket has centrally depressed upper and lower edges, and extends inwardly of the side walls to terminate at substantially vertical edges 18.1, 18.2 which are spaced apart approximately the same distance as are spaced apart the confronting edges of the inwardly extending ribs 12.2, 14.2. An indexing bar 24 extends transversely of the basket from side to side, and has its outer surface 24.1 (FIGS. 1 and 2) flush with the outer surface of the outer wall and extending between the walls edges 18.1, 18.2. To strengthen the indexing bar, and to reduce its weight, a generally rectangular groove 24.2 may be formed lengthwise in the bottom surface of the bar, as shown in FIG. 2. Slots 18.3 are formed in the outer surface of the wall 18, and extend axially inwardly as shown best in FIG. 2, the slots 18.3 and substantially vertical edges 18.1, 18.2 of the end wall cooperating with a transverse bar and edges of a plate carried by a handle, as described in my copending, commonly owned patent application Ser. No. 504,903 filed Sept. 11, 1974 and entitled Wafer Basket and Handle, the disclosure of which is incorporated herein by reference.

The end wall 18 includes a generally H-shaped flange 26 which extends from one side wall 12 to the other 14 and which is parallel to but spaced slightly inwardly of the outer surface 18.4 of the end wall 18, as shown best in FIGS. 1 and 2. The cross bar 26.1 of the flange is attached along its length to the indexing bar 24, and the flange includes stiffening gussets or plates 26.2, 26.3, 26.4 and 26.5 which extend between the side walls of the basket and the cross member of the "H"-shape flange 26, thereby rigidifying the side walls with respect to the indexing bar 24. As shown best in FIG. 1, the end wall 18 is provided with a thickened rim or border 18.5 extending inwardly of the side walls 12, 14 and to which the flange 26 is attached to yet further improve the rigidity of the basket. A generally vertical groove 18.6 may be formed in the inner edges 18.1, 18.2 of the end wall and extends downwardly to the upper surface of the indexing bar 24. An opening 18.7 in the groove at its intersection with the indexing bar facilitates drainage of the groove.

The other end wall 20 of the basket is provided with a generally U-shaped depression 20.1 in its upper edge (FIGS. 1 and 3), which depression provides access to wafers contained in the basket axially through that end. The upwardly extending legs of the U define substantially vertical, inwardly facing wall edges 20.2, 20.3, and the outer surface of the end wall 20 is provided near its top with slots 20.4, which may be identical to the slots 18.3 in the other end wall of the basket, and together with the edges 20.3, 20.3 of the end wall 20 perform the same function. The side edges of the wall 20 are generally upright, and the resulting configuration of the end wall 20, as best seen in FIG. 3, lends considerable rigidity to the basket.

Referring again to the indexing bar 24 which is mounted transversely of the end wall 18, as described above, it will be noted that the bar extends freely across the outer surface of the end wall and can readily be contacted by an appropriate automatic processing apparatus. The H-shaped flange 26 is mounted to the rear of the indexing bar, and does not interfere with the function of the latter.

As will be appreciated from the drawing, the basket 10 may be molded as an integral unit from such temperature and chemical-resistant plastics as Teflon "PFA", a perfluoroalkoxy-substituted polytetrafluoroethylene resin such that the flange 26 merges with the border 18.5 of the end wall and also with the indexing bar 24, the latter in turn merging outwardly with the outer wall surface 18.4. Plastics such as that identified above are quite flexible in the thin (eg. 1/8 inch) sections found in wafer baskets of the invention; yet, because of the gussets provided by the flange 26, coacting with the offset side walls and the transverse, upper flanges 12.7, 14.7, the basket of the invention is provided with sufficient rigidity and resistance to distortion as to permit its use not only in high-temperature processing baths as a carrier for wafers, but also in centrifuge procedures in which processing liquids are rapidly drained from wafers by centrifugal force. The H-shape flange does not add significantly to the weight of the basket nor to the amount of material required for each basket; more importantly, however, the flange neither interferes with the proper operation of the indexing bar 24 nor does it add to the length of the basket.

Manifestly, I have provided a wafer basket which is ideally suited for use in transporting wafers between processing baths at elevated temperatures and which can withstand the basket-deforming forces encountered in centrifugation of wafers during processing. The gussets provided by the H-shaped flange, in combination with the inwardly offset side walls of the basket, render the basket resistant not only to forces tending to bow the walls inwardly, but also to forces tending to twist the basket or to move the adjoining ends of the side walls toward or away from each other.

While I have described a preferred embodiment of the present invention, it should be understood that various changes, adaptations, and modifications may be made therein without departing from the spirit of the invention and the scope of the appended claims.

What is claimed is:

1. A reinforced, distortion-resistant wafer basket having an open top for insertion and removal of wafers, an open bottom, opposed, upright end walls, and side walls with inner, opposed ribs for spacing axially aligned wafers in the basket, the side walls having lower portions offset inwardly to stiffen the side walls and to support wafers from beneath, one end wall of the basket having a central recess therein with a transverse indexing bar extending thereacross intermediate the heighth of the basket, the one end wall including a transverse flange providing stiffening gussets extending between the side walls and the indexing bar to reinforce the recessed end wall against distortion and to co-act with the offset side walls to stiffen the basket and restrain twisting or bowing of the side walls.

2. A reinforced, distortion-resistant wafer basket having an open top for insertion and removal of wafers, an open bottom, opposed upright end walls, and side walls with inner, opposed ribs for spacing axially aligned wafers in the basket, the side walls having lower portions offset inwardly to stiffen the side walls and to support wafers from beneath, one end wall of the basket having a central recess therein with a transverse indexing bar extending thereacross intermediate the height of the basket and flush with the outer surface of the end wall the one end wall including a transverse flange spaced inwardly of the outer end wall surface and providing stiffening gussets extending between the side walls and the indexing bar to reinforce the recessed end wall against distortion and to co-act with the offset side walls to stiffen the basket and restrain twisting or bowing of the side walls.

3. The wafer basket of claim 2 wherein the side walls have upper edges with outwardly extending, longitudinal flanges therealong co-acting with the stiffening gussets of the end wall and the offset side wall portions to stiffen the basket.

4. The wafer basket of claim 2 wherein the other end wall has a U-shaped depression in its upper edge extending downwardly to permit access to wafers from that end axially of the basket and co-acting with the stiffening gussets of the one end and offset side wall portions to stiffen the basket.

5. A reinforced, distortion-resistant wafer basket having an open top for insertion and removal of wafers, an open bottom, opposed, upright end walls, and side walls with inner opposed ribs for spacing axially aligned wafers in the basket, the side walls being cut away intermediate their heights to define slots through the side walls between the ribs, the ribs including upright exterior stiffening gussets along their outer edges, the side walls having lower portions offset inwardly to stiffen the side walls and to support wafers from beneath, one end wall of the basket having a central recess therein with a transverse indexing bar extending thereacross intermediate the height of the basket, the one end wall including a transverse flange providing stiffening gussets extending between the side walls and the indexing bar to reinforce the recessed end wall against distortion and to co-act with the offset side walls and the upright, exterior side wall gussets to stiffen the basket and restrain twisting or bowing of the side walls.

6. The wafer basket of claim 2 wherein the end walls are provided with transverse, outwardly open slots adjacent the top of the basket for connection to a basket handle.

7. The wafer basket of claim 2 wherein the transverse flange is generally H-shaped with the cross bar of the latter joined along its length to the indexing bar to stiffen the latter and wherein the legs of the H-shaped flange define the stiffening gussets joined to the indexing bar through the cross bar of the H-shaped flange.

8. The wafer basket of claim 7 wherein the central recess in the one end wall defines spaced, upright end wall sections having spaced, confronting, upright edges with the latter having facing, stiffening grooves therein extending downwardly toward ends of the indexing bar.

9. The wafer basket of claim 7 wherein the indexing bar has a lower surface with an upwardly extending, stiffening groove therein extending toward sides of the end wall.

10. A reinforced, distortion-resistant wafer basket having an open top for insertion and removal of wafers, an open bottom, opposed upright end walls, and side walls with inner, opposed ribs for spacing axially aligned wafers in the basket, one end wall of the basket having a central recess therein with a transverse indexing bar extending thereacross in flush relationship to the outer surface of the end wall, the end wall including a generally H-shaped transverse flange parallel to but spaced axially inwardly from the outer surface of the end wall, the cross bar of the H joined along its length to the indexing bar to stiffen the latter and the legs of the H defining stiffening gussets joining side walls of the basket to the indexing bar through the cross bar of the H-shaped flange and stiffening the end wall and restraining transverse movement of upper edges of the adjoining side walls.

11. A reinforced, distortion-resistant, thin-sectioned wafer basket having an open top for insertion and removal of wafers, an open bottom, opposed upright end walls and side walls with inner, opposed and aligned ribs for spacing axially aligned wafers in the basket, the side walls having lower portions offset inwardly to stiffen the side walls against bowing and to support wafers from beneath, one end wall of the basket having a central recess therein with an indexing bar extending transversely across the recess in flush relationship to the outer surface of the end wall and intermediate the heighth of the basket, the one end wall including a generally H-shaped flange parallel to but spaced axially inwardly of the outer surface of the end wall with the cross bar of the H-shaped flange joined along its length to the indexing bar to stiffen the latter and the legs of the H-shaped flange defining stiffening gussets joining the side walls of the basket above and below the indexing bar to the indexing bar through the cross bar of the flange, the stiffening gussets co-acting with the offset side wall portions to stiffen the basket against twisting, bowing, or other deformation.

12. The wafer basket of claim 11 wherein the side walls have upper edges with outwardly extending, substantially horizontal stiffening flanges therealong co-acting with the end wall stiffening gussets and the inwardly offset side wall portions to stiffen the side walls against bowing.

13. The wafer basket of claim 12 wherein the other end wall of the wafer basket has an upper edge with a smoothly curved, U-shaped recess therein extending downwardly to provide access to wafers from that end axially of the basket and co-acting with the inwardly offset side wall portions, the stiffening gussets of the one end wall, and the flanges at upper edges of the side wall to restrain twisting of the basket and bowing of the side walls.

* * * * *

UNITED STATES PATENT AND TRADEMARK OFFICE
CERTIFICATE OF CORRECTION

REEXAMINATION CERTIFICATE: (775th)

PATENT NO. : B1 3,961,877      Page 1 of 2
DATED : November 3, 1987
INVENTOR(S) : Douglas M. Johnson It is certified that error appears in the above-identified patent and that said Letters Patent is hereby corrected as shown below: On the Title page:

At page 1, in "References Cited" section, please add the following:

U.S. Patent Documents

| | | |
|---|---|---|
| 2,156,955 | 5/1939 | Page |
| 2,194,828 | 3/1940 | Greaves |
| 2,453,030 | 11/1948 | Neuman |
| 2,774,472 | 12/1956 | Badalich |
| 2,813,633 | 11/1957 | Welling |
| 3,442,395 | 5/1969 | Taylor |
| 3,480,151 | 11/1969 | Schmitt |

Foreign Patent Documents 1,334,330   10/1973    United Kingdom

Other Publications

IBM Technical Disclosure Bulletin, "Wafer Package", L. Hershoff, April 1966, Vol. 8, No. 11

UNITED STATES PATENT AND TRADEMARK OFFICE
CERTIFICATE OF CORRECTION

PATENT NO. : REEXAMINATION CERTIFICATE (775th)
B1 3,961,877        Page 2 of 2
DATED     : November 3, 1987
INVENTOR(S) : Douglas M. Johnson It is certified that error appears in the above-identified patent and that said Letters Patent is hereby corrected as shown below:

At page 1, in "References Cited" section, please add the following:

Other Publications

DeFries - "Etch Boat for Wafers", Vol. 14, No. 10, 3/72.

Signed and Sealed this

Eighth Day of March, 1988

Attest:

DONALD J. QUIGG

Attesting Officer          Commissioner of Patents and Trademarks

REEXAMINATION CERTIFICATE (775th)
United States Patent [19]
Johnson

[11] B1 3,961,877

[45] Certificate Issued    Nov. 3, 1987

[54] REINFORCED WAFER BASKET

[75] Inventor: Douglas M. Johnson, Carver, Minn.

[73] Assignee: Fluoroware, Inc., Chaska, Minn.

Reexamination Request:
No. 90/001,187, Mar. 9, 1987

Reexamination Certificate for:
Patent No.: 3,961,877
Issued: Jun. 8, 1976
Appl. No.: 504,904
Filed: Sep. 11, 1974

[51] Int. Cl.$^4$ ............................................. F27D 5/00
[52] U.S. Cl. ................................... 432/253; 214/26; 432/261; 220/19; 220/71
[58] Field of Search .................... 432/261, 253, 258; 220/19, 71; 99/447

[56] References Cited

U.S. PATENT DOCUMENTS

| | | | |
|---|---|---|---|
| D. 221,688 | 8/1971 | Elsefelder | D55/1 |
| 912,472 | 2/1909 | Hart | |
| 1,764,754 | 6/1930 | Scott | |
| 1,885,691 | 11/1932 | Dressler | 432/253 |
| 2,019,722 | 11/1935 | Neumeyer | 224/43 |
| 2,407,021 | 9/1946 | Langel | 220/71 |
| 2,612,401 | 9/1952 | Simmonds | 294/27 |
| 2,729,375 | 1/1956 | Pace | 226/14 |
| 3,160,283 | 12/1964 | LaChance | 211/184 |
| 3,365,070 | 1/1968 | Miles | 211/126 |
| 3,394,819 | 7/1968 | Saville | |
| 3,467,242 | 9/1969 | DeRousse | 206/1 |
| 3,473,670 | 10/1969 | Elftmann | 211/41 |
| 3,486,631 | 12/1969 | Rodman | 211/41 |
| 3,487,948 | 1/1970 | Haidegger | 211/41 |
| 3,498,597 | 3/1970 | Roberts et al. | 432/261 |
| 3,501,047 | 3/1970 | Raabe | 220/71 |
| 3,534,862 | 10/1970 | Shambelan | 211/41 |
| 3,645,581 | 2/1972 | Lasch | 302/2 R |
| 3,701,558 | 10/1972 | Baker | 294/33 |
| 3,737,282 | 6/1973 | Hearn | 432/253 |
| 3,819,076 | 6/1974 | Hammon et al. | 432/253 |
| 3,828,726 | 8/1974 | Dietze et al. | 118/500 |
| 3,850,296 | 11/1974 | Hirata et al. | 211/41 |
| 3,923,156 | 12/1975 | Wallestad | |
| 3,926,305 | 12/1975 | Wallestad | |
| 3,930,684 | 1/1976 | Lasch | 302/2 R |
| 3,939,973 | 2/1976 | Wallestad | |
| 3,947,236 | 3/1976 | Lasch | 432/11 |

OTHER PUBLICATIONS

Modern Industrial Plastics, copyright 1974, pp. cover, 116–126.
Journal of Teflon, Apr. 1966, pp. 1–5.
Plastics World, Sep. 1973, p. 33.
Plastics World, May 1973, p. 31.
Plastic Product Design, copyright 1970, pp. iv, v, 18–21, 89–185, 344–361.
Plastics World, Apr. 1972, pp. 40, 41, 42, 43, 44.
Plastics World, May 1971, pp. 27–28.
Plastics World, May 1971, pp. 62, 63.
Industrial Plastics, 1939, pp. 286, 287, 308, 309.
Hutchinson's Technical & Scientific Encyclopedia, 1935, vol. 2, p. 1214.
Plastics World, Oct. 1972, p. 31.
Applied Plastic Product Design, 1946, pp. 48–53.
Plastics Handbook for Product Engineers, 1946, Part II, pp. 311, 344, 345.
Handbook of Plastics, 1943, Chapter XXII, pp. 834, 855.
Elementary Structural Analysis, 1948, pp. 14, 15.
The Production and Property of Plastics, 1947, pp. 317, 330–331.
An Introduction to Engineering Plastics, 1947, pp. 3, 10, 11.
Tool Engineers Handbook, 1959, pp. 47-9, 47-11.
Plastics Engineering Handbook, 1954, Chapter 12 (1st pg.), pp. 422–425.
Structural Design in Metals, 1949, pp. 96, 97.
Plastics Engineering Handbook, 1960, pp. xii, 286, 301, 302.
Dictionary of Terms Used in the Theory and Practice of Mechanical Engineering, 1960, pp. 168, 287.
Machinery's Handbooks, Sixteenth Edition, 1959, pp. 349–411.
Engineering Design for Plastics, 1964, Chapter 20, pp. 1155, 1159, 1171, 1172, 1173.
Fundamentals of Tool Design, 1962, pp. 299, 300.
Engineering Data for Product Design, 1961, pp. 20–21.
Engineering Plastics and Their Commercial Development, 1969, pp. 4–5.
Plastics Mold Engineering, Revised Edition, 1965, pp. 71, 76, 77.
Plastics Technology, 1965, Injection-Molding Thermal Plastics, pp. 157, 158, 166.
Materials Engineering, 6/71, Engineers Guide to Phenolic Plastics, pp. 29–32.
Materials Engineering, 8/72, Fluoropolymers Now are Tougher and Easier to Process, pp. 30–34.
Plastics Design and Processing, 1/74, How to Avoid Warpage Problems in Injection Molded Parts, pp. 25–27.
Brochure, Industrial Modular Systems Corp., copyright 1971, Wafer Carriers.

(List continued on next page.)

*Primary Examiner*—Henry C. Yuen

[57]      ABSTRACT

A distortion-resistant wafer basket with an open top for insertion and removal of wafers and opposed side and end walls with the side walls having lower portions offset inwardly. An end wall is provided with a transverse indexing bar across its width and gussets joining opposing side walls with the indexing bar and spaced axially inwardly of the outer surface of the end wall. The gussets strengthen the end wall against distortion, and co-act with the offset side walls to stiffen the basket and to restrain twisting or bowing of the side walls.

OTHER PUBLICATIONS

Peninsula Electronics 3/29/71, photograph excerpt.
Materials Engineering, 12/71, Versatile Engineering Thermal Plastic Combines Dimensional Stability, Resistance to Heat and Water, pp. 20, 22-29.
Fluoroware, Inc., New Products Supplement to 6/70 Catalog, pp. 2-16.
Brochure, Industrial Modular Systems Corp., copyright 1971, Loader/Unloader and Sender/Receiver.
Fluoroware, Inc. 8/68, Catalog of New Items–Semi-Conductor Processing Equipment, pp. 1, 2.
Brochure, Industrial Modular Systems Corp., Automatic Photoresis Coater, Model. No. 6604, 4 pgs., copyright 1968.
Emerson Plastronics, Inc., typewritten brochure, 3 pgs., "Throw Away Your Tweezers", 2/72.
Fluoroware, Inc. Catalog, 1/73, Semi-Conductor Processing Equipment and Labware, Plastics Catalog, pp. 1, 2, 5, 6, 7, 16, 17.
Fluoroware, Inc. New Products Catalog, 6/73, pp. 1, 2, 3, 4, 5, 6, last page.
Fluoroware, Inc. 1/74, Semi-Conductor Processing Equipment and Labware Catalog, pp. 2, 3, 9.
Fluoroware, Inc. Catalog, 2/68, Semi-Conductor Processing Equipment Catalog, p. 6.
Fluoroware, Inc. Catalog, 6/70, Semi-Conductor Processing Equipment and Labware, p. 4.
Fluoroware, Inc. Catalog, 2/72, Semi-Conductor Processing Equipment and Labware, pp. 2, 3, 6, 8.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-13 is confirmed.

* * * * *